United States Patent
Birner et al.

(10) Patent No.: US 10,134,603 B2
(45) Date of Patent: Nov. 20, 2018

(54) METHOD OF PLANARISING A SURFACE

(71) Applicant: Infineon Technologies AG, Neubiberg (DE)

(72) Inventors: Albert Birner, Regensburg (DE); Helmut Brech, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/273,303

(22) Filed: Sep. 22, 2016

(65) Prior Publication Data
US 2018/0082853 A1    Mar. 22, 2018

(51) Int. Cl.
| | |
|---|---|
| *H01L 21/3105* | (2006.01) |
| *H01L 29/205* | (2006.01) |
| *H01L 29/20* | (2006.01) |
| *H01L 21/02* | (2006.01) |
| *H01L 29/778* | (2006.01) |
| *H01L 29/66* | (2006.01) |

(52) U.S. Cl.
CPC .... *H01L 21/31056* (2013.01); *H01L 21/0254* (2013.01); *H01L 21/31053* (2013.01); *H01L 29/2003* (2013.01); *H01L 29/205* (2013.01); *H01L 21/0242* (2013.01); *H01L 21/02378* (2013.01); *H01L 21/02381* (2013.01); *H01L 21/02433* (2013.01); *H01L 29/66462* (2013.01); *H01L 29/778* (2013.01)

(58) Field of Classification Search
None
See application file for complete search history.

(56) References Cited

U.S. PATENT DOCUMENTS

| | | | |
|---|---|---|---|
| 5,378,316 A | 1/1995 | Franke et al. | |
| 5,431,775 A * | 7/1995 | Prince | G02B 6/1221 216/24 |
| 5,498,565 A * | 3/1996 | Gocho | H01L 21/3065 257/E21.218 |
| 5,643,836 A | 7/1997 | Meister et al. | |
| 5,958,795 A * | 9/1999 | Chen | H01L 21/76229 257/E21.244 |
| 5,961,794 A * | 10/1999 | Morita | H01L 21/76229 204/192.34 |
| 5,998,279 A * | 12/1999 | Liaw | H01L 21/76232 257/E21.548 |

(Continued)

FOREIGN PATENT DOCUMENTS

GB    2275129 A    8/1994

*Primary Examiner* — Allan Olsen
(74) *Attorney, Agent, or Firm* — Murphy, Bilak & Homiller, PLLC (57) ABSTRACT

In an embodiment, a method of planarizing a surface includes applying a first layer to a surface including a protruding region including at least one compound semiconductor and a stop layer on an upper surface such that the first layer covers the surface and the protruding region, removing a portion of the first layer above the protruding region and forming an indentation in the first layer above the protruding region, the protruding region remaining covered by material of the first layer, and progressively removing an outermost surface of the first layer to produce a planarized surface including the stop layer on the upper surface of the protruding region and an outer surface of the first layer.

23 Claims, 10 Drawing Sheets

(56) References Cited

U.S. PATENT DOCUMENTS

| | | | | |
|---|---|---|---|---|
| 6,004,863 A * | 12/1999 | Jang | ............... | H01L 21/76229 257/E21.245 |
| 6,057,207 A * | 5/2000 | Lin | ............... | H01L 21/76224 257/E21.546 |
| 6,103,592 A * | 8/2000 | Levy | ............... | H01L 21/76229 257/E21.548 |
| 6,107,187 A * | 8/2000 | Lao | ............... | H01L 21/31056 257/E21.246 |
| 6,140,224 A * | 10/2000 | Lin | ............... | H01L 21/76829 257/E21.576 |
| 6,171,896 B1 * | 1/2001 | Jang | ............... | H01L 21/76229 257/E21.548 |
| 6,365,523 B1 * | 4/2002 | Jang | ............... | H01L 21/31053 257/E21.244 |
| 6,372,605 B1 * | 4/2002 | Kuehne | ............... | H01L 21/76229 257/510 |
| 6,528,389 B1 * | 3/2003 | Allman | ............... | H01L 21/31053 257/E21.244 |
| 6,869,858 B2 * | 3/2005 | Jang | ............... | H01L 21/76245 257/E21.244 |
| 7,164,837 B2 * | 1/2007 | Kang | ............... | G02B 6/132 385/129 |
| 2002/0004284 A1 * | 1/2002 | Chen | ............... | H01L 21/76229 438/427 |
| 2002/0055258 A1 | 5/2002 | Nakasato | | |
| 2002/0094493 A1 * | 7/2002 | Chen | ............... | H01L 21/31053 430/311 |
| 2003/0151020 A1 * | 8/2003 | Lee | ............... | B81C 1/00611 252/2 |
| 2003/0153135 A1 | 8/2003 | Kim et al. | | |
| 2003/0194848 A1 | 10/2003 | Jang et al. | | |
| 2008/0210977 A1 | 9/2008 | Okita | | |
| 2009/0146186 A1 | 6/2009 | Kub | ............... | H01L 29/1602 257/194 |
| 2012/0107646 A1 * | 5/2012 | Rawat | ............... | G11B 5/743 428/831 |
| 2012/0146134 A1 * | 6/2012 | Kamada | ............... | H01L 29/66462 257/330 |
| 2013/0052784 A1 | 2/2013 | Sugioka et al. | | |
| 2014/0054596 A1 * | 2/2014 | Ritenour | ............... | H01L 27/0248 257/76 |
| 2014/0061659 A1 * | 3/2014 | Teplik | ............... | H01L 29/402 257/76 |
| 2015/0349105 A1 | 12/2015 | Curatola et al. | | |
| 2016/0099309 A1 | 4/2016 | Derluyn et al. | | |

* cited by examiner

FIG 10

METHOD OF PLANARISING A SURFACE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large current densities, support high breakdown voltages and to provide very low on-resistance, ultra-fast switching times and improved power efficiency.

SUMMARY

In an embodiment, a method of planarising a surface includes applying a first layer to a surface including a protruding region including at least one compound semiconductor and a stop layer on an upper surface such that the first layer covers the surface and the protruding region, removing a portion of the first layer above the protruding region and forming an indentation in the first layer above the protruding region, the protruding region remaining covered by material of the first layer, and progressively removing an outermost surface of the first layer to produce a planarised surface including the stop layer on the upper surface of the protruding region and an outer surface of the first layer.

In an embodiment, a method of fabricating a semiconductor wafer includes depositing an insulating layer onto a substrate including a mesa including a stop layer arranged on at least one Group III nitride such that an upper surface of the substrate and the mesa are covered with the insulating layer, forming a structured mask on the insulating layer having an opening above the mesa, the opening having a lateral area smaller than a lateral area of the mesa, removing a portion of the insulating layer within the opening and reducing a thickness of the portion of the insulating layer arranged above the mesa, and progressively removing the mask and portions of the insulating layer to produce a planarised surface including a surface of the stop layer and a surface of the insulating layer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off. An enhancement-mode device is not limited to low voltages and may also be a high-voltage device.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where $0<x<1$.

Figure 1:
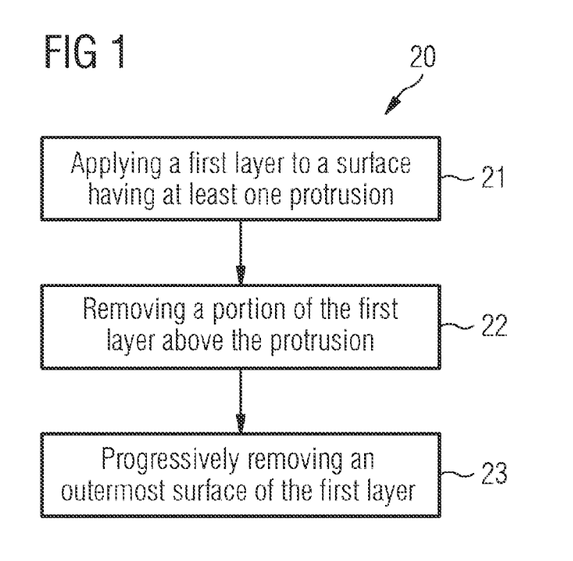
FIG. 1 illustrates a flow chart of a method of planarising a surface.

FIG. 1 illustrates a flowchart 20 of a method of planarising a surface.

In box 21, a first layer is applied to a surface that includes at least one protruding region including at least one compound semiconductor and a stop layer on an upper surface. The first layer is applied such that it covers the surface and the protruding region including the stop layer. In some embodiments, the first layer completely covers the upper surface of the substrate, the protruding region and the stop layer.

In box 22, a portion of the first layer above the protruding region is removed and an indentation is formed in the first layer above the protruding region. The protruding region including the stop layer remains covered by material of the first layer.

In box 23, an outermost surface of the first layer is progressively removed to produce a planarised surface including the stop layer arranged on the upper surface of the protruding region and an outer surface of the first layer.

In the planarised surface, the upper surface of the protruding region and the outer surface of the first layer are substantially coplanar. For example, any difference in height between the protruding regions and first layer is less than 10% of the height of the protruding region.

The stop layer may include a material having an etch selectivity of greater than 1000 over the material of the first layer for a given etch composition. The material of the first layer has the higher etching rate.

In some embodiments, the stop layer includes carbon. The stop layer may include amorphous hydrogenated carbon (a-C:H). In some embodiments, the stop layer includes a carbon layer deposited using PECVD (Plasma Enhanced Chemical Vapour Deposition) and $CH_4$ as a source gas.

The outermost surface of the first layer may be progressively removed by chemical mechanical polishing (CMP).

Chemical mechanical polishing is a method in which the surface is ground or polished with use of a slurry having a composition including particles to remove material by mechanical or abrasive polishing and components selected to remove material by chemical reaction, for example by etching.

The composition of the slurry may define the selectivity to other materials, for example so called landing pads.

A slurry used for chemical mechanical polishing to produce the planarised surface may be a colloidal silica-based slurry, for example a Klebosol® based slurry.

The indentation in the first layer above the protruding region may have a lateral area that is smaller than the lateral area of the protruding region. The first layer may have a protrusion defining the indentation that is arranged above the periphery of the protruding region.

The surface including the at least one protruding region may be the surface of a substrate for supporting the fabrication of semiconductor devices. The substrate may be a wafer such as a single crystal silicon wafer, silicon carbide wafer, or a sapphire wafer.

The protruding region may include one or more semiconductor materials, for example one or more compound semiconductors such as one or more Group III nitride layers. The material of the protruding region may differ from material of the underlying substrate. Each of the protruding regions may include structures suitable for fabricating a semiconductor device, such as a transistor device. The planarised surface resulting from the use of the method may be used to support the subsequent deposition of a metallisation structure for the semiconductor devices onto the planarised surface.

The planarised surface may include an outer surface of the stop layer and an outer surface of the first layer so that the first layer is completely removed from above the protruding region. In some embodiments, the stop layer is removed after the progressive removal is finished, for example after chemical mechanical polishing, such that the planarised surface includes an outer surface of the protruding region and an outer surface of the first layer.

The first layer may include an insulating material such as an oxide, for example silicon oxide, and be of a different composition from the composition of the protruding region and the composition of the substrate.

The planarised surface may be formed by progressively removing the outermost surface of the first layer until all of the material of the first layer positioned above the protruding region is removed and such that the outer surface of the first layer in regions adjacent the protruding region is substantially coplanar with the stop layer arranged on the protruding region. This method may be carried out by chemical mechanical polishing.

The first layer is planarised in two stages. In a first stage, portions of the first layer are selectively removed from regions above the protruding region to produce an indentation such that the thickness of the first layer above the protruding region is less than in regions adjacent the protruding region. In some embodiments, the thickness of the portion of the first layer arranged above the protruding region is reduced by 80% to 90% of the initial thickness of the first layer above the protruding region. The indentation in the first layer is surrounded by a wall of material of the first layer. The protruding region remains covered by material of the first layer after the first stage of the planarization process.

In some embodiments, the indentation has a lateral area which is less than the lateral area of the protruding region and may be positioned such that the edges of the protruding region are covered with a portion of the first layer having greater thickness than the central portion of the protruding region.

The indentation in the first layer above the protruding region may be formed by applying a structured mask to the first layer having an opening above the protruding region.

The structured mask together with the first layer may provide a protrusion at edges of the upper surface of the protruding region.

The portions of the first layer may be selectively removed from regions above the protruding region such that the base of the resulting indentation lies in a plane that is spaced at substantially the same distance from the surface or further from the surface than the upper surface of regions of the first layer that are arranged laterally adjacent and laterally spaced apart from the protruding regions.

In a second stage, the outer most surface of the first layer is removed, in particular, progressively removed over the entire surface of the substrate so that the underlying stop layer on the protruding region is revealed. The stop layer lies in a plane that is substantially coplanar with a plane in which the outer surface of the first layer in regions adjacent the protruding region lies.

This selective removal of portions of the first layer above the protruding region before chemical mechanical polishing the entire area of the first layer assists in providing a well planarised surface, for example a planarised surface having a reduced height difference between the protruding regions and the first layer which surrounds side faces of the protruding region.

This two stage planarization method may also be repeated one or more times by depositing a second layer, forming second indentations above the protruding regions and performing a further chemical mechanical polishing process to produce a planarised surface.

Figure 2:
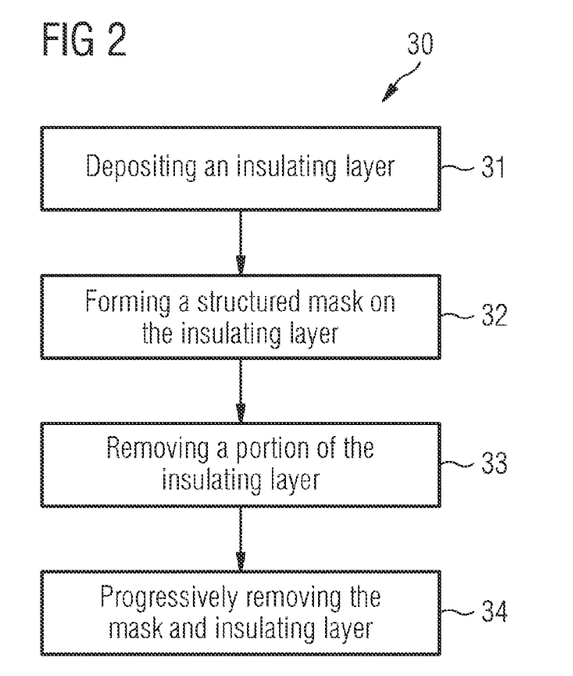
FIG. 2 illustrates a flow chart of a method of planarising a surface.

FIG. 2 illustrates a flowchart 30 of the method of fabricating a semiconductor wafer.

In box 31, an insulating layer is deposited onto a substrate including at least one mesa. The mesa may include at least one semiconductor, for example a compound semiconductor, and a stop layer arranged on the semiconductor. In some embodiments, the compound semiconductor is a Group III nitride and the stop player is arranged on the outermost Group III nitride. The substrate may be a semiconductor wafer. The insulating layer is deposited such that an upper surface of the substrate and the mesa, including the stop layer, are covered with the insulating layer.

In box 32, a structured mask is formed on the insulating layer which has an opening above the mesa or in the case of a plurality of mesas an opening above each of the mesas. The opening has a lateral area smaller than the lateral area of the mesa.

In box 33, a portion of the insulating layer within the opening is removed and the thickness of the portion of the insulating layer arranged above the mesa is reduced.

In some embodiments, an indentation may be formed in the insulating layer above the mesa and the mesa and the stop layer remains covered by the portion of the insulating layer under the indentation.

In box 34, the mask and portions of the insulating layer are removed to produce a planarised surface including a surface of the stop layer and a surface of the insulating layer.

The mask may be removed and portions of the insulating layer removed to produce a planarised surface by progressive removal of the mask and the insulating layer, for example by chemical mechanical polishing.

The insulating layer may include an oxide, such as a silicon oxide which may be deposited using plasma enhanced Chemical Vapour Deposition (CVD) or Physical Vapour Deposition (PVD), for example.

An initial thickness of the insulating layer above the mesa may be reduced by 80% to 90%. The insulating layer and the structured mask provide a protrusion at edges of the mesa.

In some embodiments, the stop layer comprises carbon, for example amorphous hydrogenated carbon.

The mesa may have dimensions suitable for forming a semiconductor device, such as a transistor device. The substrate may include a semiconductor wafer having a surface capable of supporting the epitaxial growth of one or more Group III nitride layers. Each mesa may include a structure suitable for forming a semiconductor device. For example, to form a Group III nitride-based transistor device such as a High Electron Mobility Transistor (HEMT), each mesa may include a transition or buffer structure arranged on the upper surface of the substrate, a channel layer arranged on the transition structure and a barrier layer arranged on the channel layer, whereby the channel layer and the barrier layer include Group III nitride-based materials of differing bandgap such that a heterojunction is formed between the barrier layer and the channel which is capable of supporting a two-dimensional charge gas produced by piezoelectric and spontaneous polarization. In some embodiments, the channel layer includes gallium nitride and the barrier layer includes aluminium gallium nitride ($Al_xGa_{(1-x)}N$, where $0<x<1$).

The structured mask may include a photosensitive material so that the mask can be formed by photolithographic techniques.

The mesa may be formed by first depositing a selected semiconductor structure continuously over the upper surface of the substrate and removing regions of this layer to produce the at least one mesa protruding from the upper surface of the substrate. The upper surface material of the substrate may be exposed in regions adjacent the mesa. In some embodiments, the outermost surface of the substrate is removed in regions adjacent the mesas so that the mesas are arranged on raised regions of the substrate.

Figure 3:
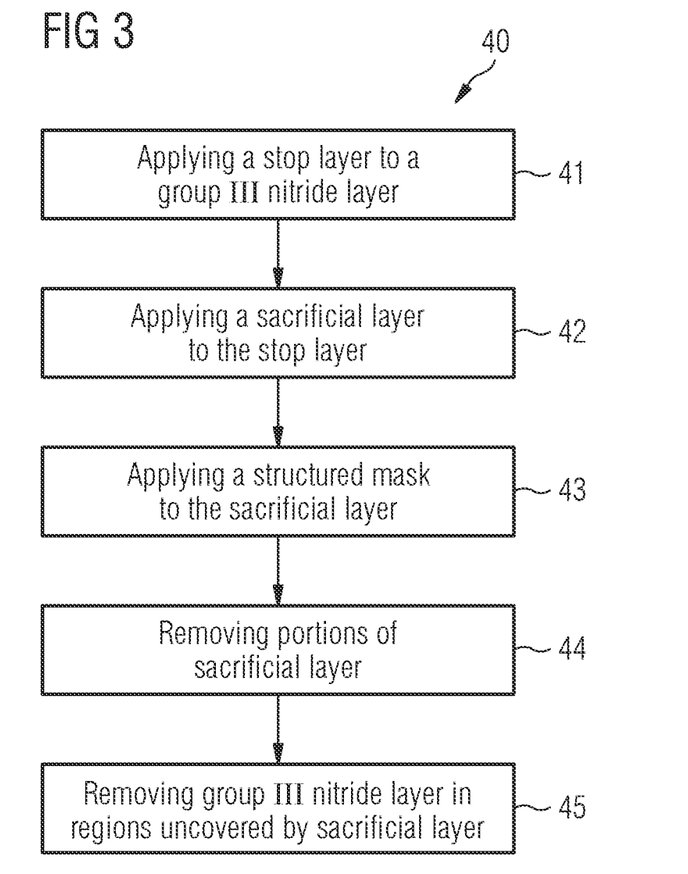
FIG. 3 illustrates a flow chart of a method of fabricating a mesa on a substrate.

FIG. 3 illustrates a flowchart 40 of the method for fabricating at least one mesa on a substrate from a continuous layer including at least one compound semiconductor such as at least one III nitride.

In some embodiments, the continuous layer includes a semiconductor structure suitable for forming a semiconductor device, for example two or more Group III nitride layers arranged in a stack. For example, the layer may include a semiconductor structure having a stack of Group III nitride layers, two or which have different bandgaps forming a heterojunction at which a two-dimensional charge gas may be formed by piezoelectric and spontaneous polarisation.

In box 41, a stop layer is applied onto the Group III nitride layer. The stop layer may be continuous.

In box 42, a sacrificial layer is applied onto the stop layer. The sacrificial layer may also be continuous and may include an insulating layer, for example an oxide such as silicon oxide.

In box 43, a structured mask is applied to the sacrificial layer which has one or more openings. The structured mask may include a photosensitive material, for example.

In box 44, portions of the sacrificial layer exposed in the openings of structured mask and underlying areas of the stop layer are removed to expose areas of the underlying compound semiconductor layer.

In box 45, the Group III nitride layer is removed in regions uncovered by the sacrificial layer in order to form at least mesa including the Group III nitride layer on the upper surface of the substrate.

In some embodiments, the structured mask is first removed and the remaining portions of the sacrificial layer are used as a mask during the removal of the compound semiconductor layer. In these embodiments the mesa includes the semiconductor layer, the stop layer and the sacrificial layer after its formation from the continuous layer. The sacrificial layer may be removed before a subsequent planarisation process, such as one or more of the methods described in connection with FIGS. 1 and 2, is performed.

In some embodiments, the substrate is a semiconductor wafer having a diameter of 200 mm and the surface roughness of the planarised surface may be ±10%. The substrate may include a <100> silicon wafer, a <111> silicon wafer, a sapphire wafer or silicon carbide. The mesa may have a height of 0.5 µm to 10 µm. In some embodiments, the Group III nitride layer is removed such that a total area occupied by the mesas lies within 10% to 90% of a total area of the substrate.

In some embodiments, the stop layer is removed from the mesa after formation of the planarised surface. The stop layer may be removed by oxidising the stop layer.

An example of a method for fabricating a semiconductor wafer with semiconductor mesas embedded in an insulating matrix and a planarised surface will now be described with reference to FIGS. 4 to 11.

Figure 4:
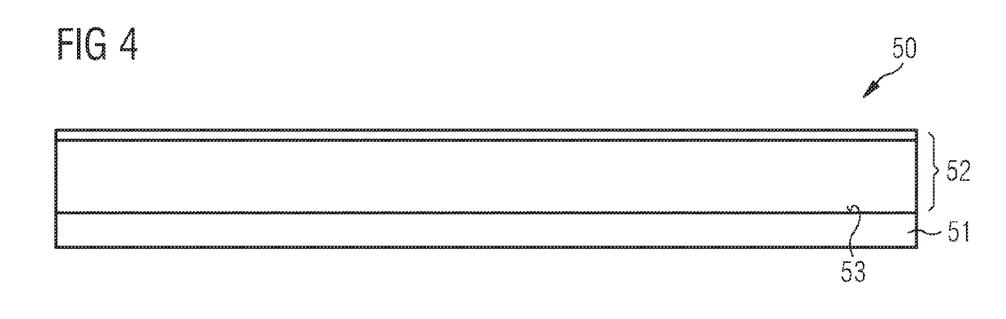
FIG. 4 illustrates a substrate including a layer including a semiconductor structure.

FIGS. 4 to 8 illustrate embodiments for fabricating a semiconductor wafer including a plurality of mesas including a semiconductor structure arranged on a substrate FIG. 4 illustrates a cross-sectional view of a portion of a semiconductor wafer 50 including a substrate 51 and a Group III nitride-based semiconductor structure 52 arranged on an upper surface 53 of the substrate 51.

The substrate 51 may include a single crystal wafer having an upper surface 53 capable of supporting the epitaxial growth of one or more Group III nitride layers. The substrate 51 may include a silicon wafer, for example a <111> or <100> silicon wafer, sapphire or silicon carbide. The Group III nitride-based semiconductor structure 52 may include a buffer structure arranged on the upper surface 53, a gallium nitride (GaN) channel layer arranged on the buffer structure and an aluminium gallium nitride ($Al_xGa_{(1-x)}N$, where $0<x<1$) channel layer arranged on the buffer layer. A heterojunction is formed between the channel layer and the barrier layer which is capable of supporting a two-dimensional charge gas, such as two-dimensional electron gas (2DEG) or two-dimensional hole gas (2DHG).

However, the Group III nitride-based semiconductor structure 52 may not limited to this arrangement and may have other arrangements.

Figure 5:
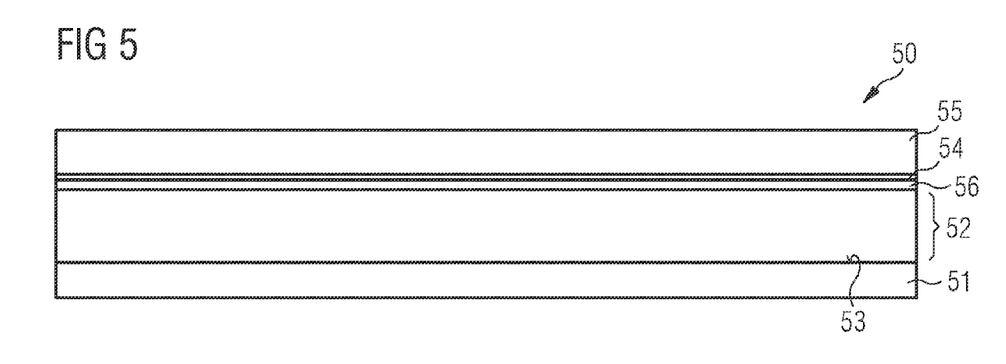
FIG. 5 illustrates a stop layer and a sacrificial layer arranged on the semiconductor structure.

FIG. 5 illustrates a cross-sectional view of a stop layer 54 arranged on the upper surface of the Group III nitride-based semiconductor structure 52 and an insulating layer 55 arranged on the stop layer 54. The Group III nitride-based semiconductor structure 52, stop layer 54 and insulating layer 55 may be continuously deposited on the upper surface 53 of the substrate 51. The stop layer 54 may include amorphous hydrogenated carbon. The insulating layer 55 may include an oxide such as silicon oxide.

The semiconductor structure 52 may have a thickness of 0.5 µm to 10 µm, the stop layer 54 may have a thickness of 10 nm to 200 nm and the insulating layer 55 may have a thickness of around 1 µm.

In some embodiments, a passivation layer 56 is arranged on the Group III nitride-based semiconductor structure 52 and the stop layer 54 is arranged on the passivation layer 56. The passivation layer 56 may include $SiN_x$. The passivation layer 56 may have a thickness of 100 nm. At least portions of the passivation layer 56 may be present in the final device structure.

Figure 6:
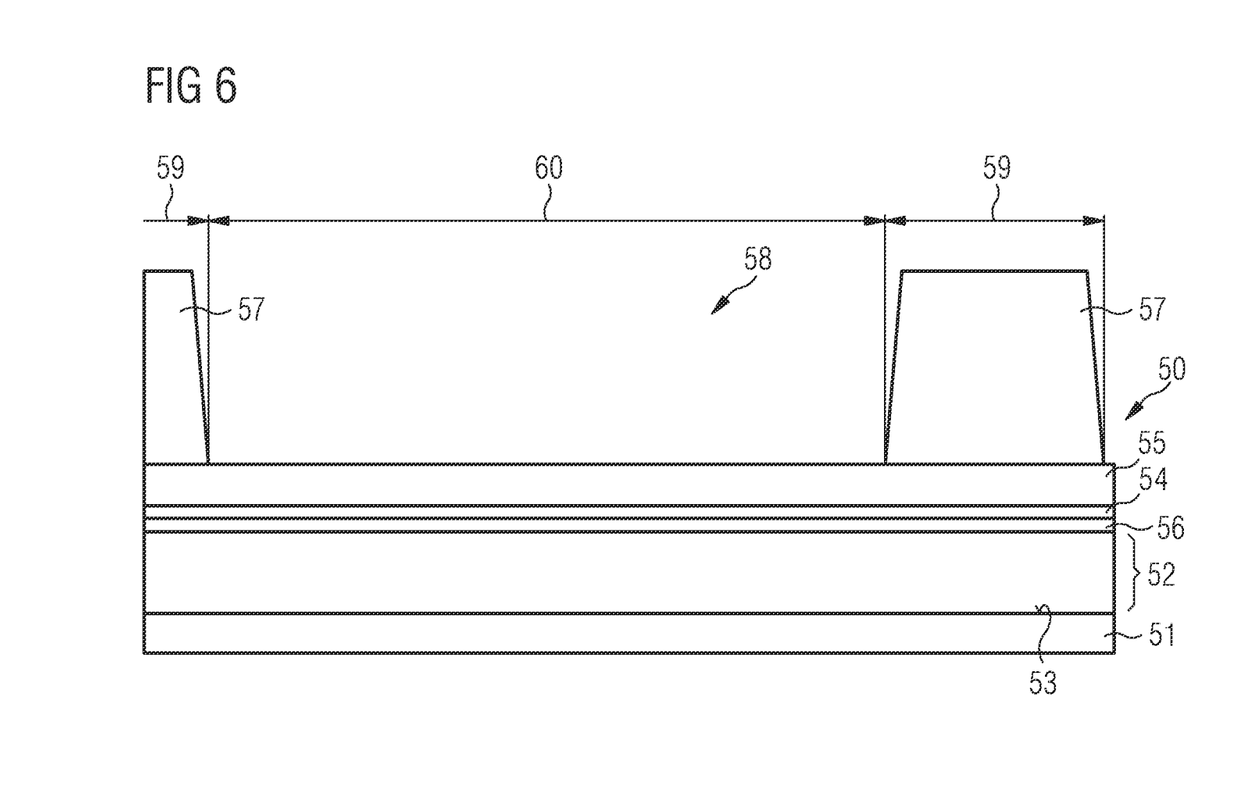
FIG. 6 illustrates a structured mask on the sacrificial layer.

FIG. 6 illustrates the application of a structured mask 57 on the insulating layer 55 which includes openings 58 above portions of the underlying insulating layer 55 which are to be removed. The mask 57 covers portions of the underlying insulating layer 55, stop layer 54 and Group III nitride semiconductor structure 52 at positions in which a protruding region or mesa is to be formed on the upper surface 53 of the substrate 51. These positions may be termed device regions 59 and the remaining regions may be termed passive regions 60. The mask 57 may include a photosensitive material so that a structured mask 57 can be formed by photolithographic techniques.

Figure 7:
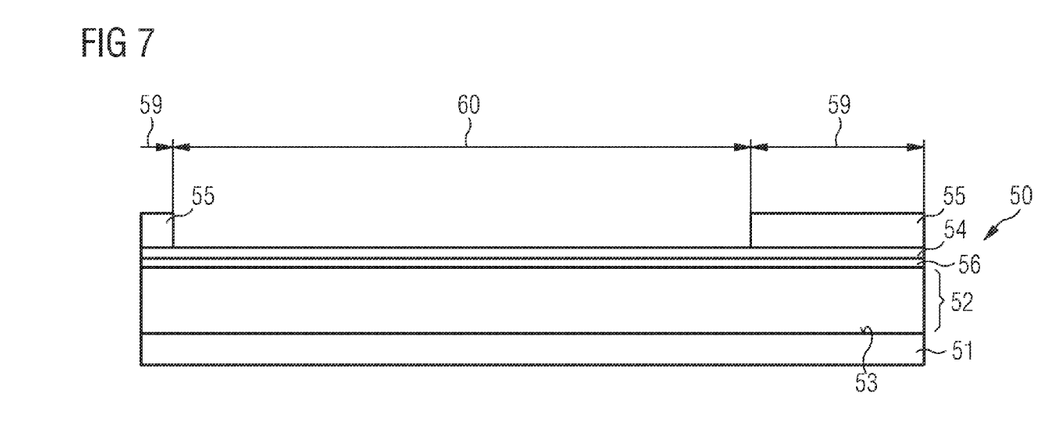
FIG. 7 illustrates the substrate after removal of portions of the sacrificial layer.

FIG. 7 illustrates the semiconductor wafer 50 after removal of the portion of the insulating layer 55 uncovered in the base of the openings 58 in the passive region 60 such that the insulating layer 55 remains in the device regions 59 of the substrate 50. The mask 57 may be removed, for example by an ashing process so that in the passive region 60, the stop layer 54 forms the uppermost surface whereas in the device regions 59 the insulating layer 55 forms the uppermost surface.

Figure 8:
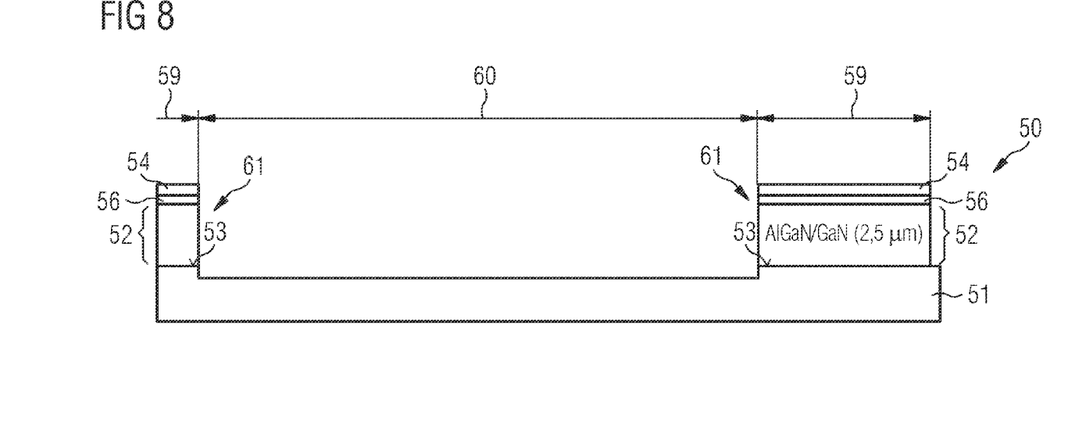
FIG. 8 illustrates the substrate after removal of portions of the semiconductor structure from the substrate and of the sacrificial layer from remaining portions of semiconductor structure to form mesas on the substrate.

The remaining portions of the insulating layer 55 may be used as a mask during the removal of the semiconductor structure 52 in the passive regions 60. The remaining portions of the insulating layer 55 may be subsequently removed, as is illustrated in FIG. 8. As a result, the semiconductor wafer 50 includes a protruding region or mesa 61 on the upper surface 53 of the substrate 41 in the device regions 59. The mesa 61 includes the semiconductor structure 52, passivation layer 56 and stop layer 54. The mesas 61 are laterally spaced apart from one another by regions of the substrate 51 in the passive regions 60.

In some embodiments, a portion of the surface 53 of the substrate 51 is also removed in the passive regions 60 such that the remaining portions of the semiconductor structure 52 and stop layer 54 in the device regions 59 are positioned on a raised region of the substrate 51.

The mesas 61 may have a height in the range of 1 µm to 10 µm and have lateral dimensions suitable for forming a semiconductor device or active region of a semiconductor device.

In some embodiments, it is desirable that the outermost surface of the semiconductor wafer 50 is planarised, for example before further processing the semiconductor structure 52 of the mesas 61, for example before applying a metallisation structure.

Figure 9:
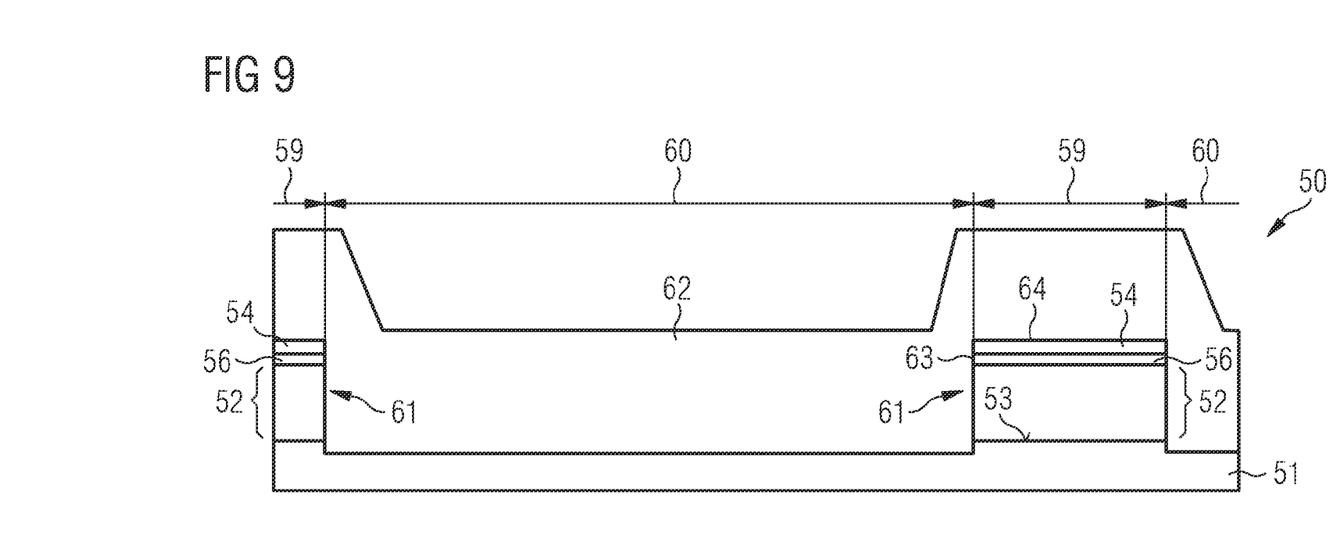
FIG. 9 illustrates an insulating layer on the substrate and the mesas.
Figure 10:
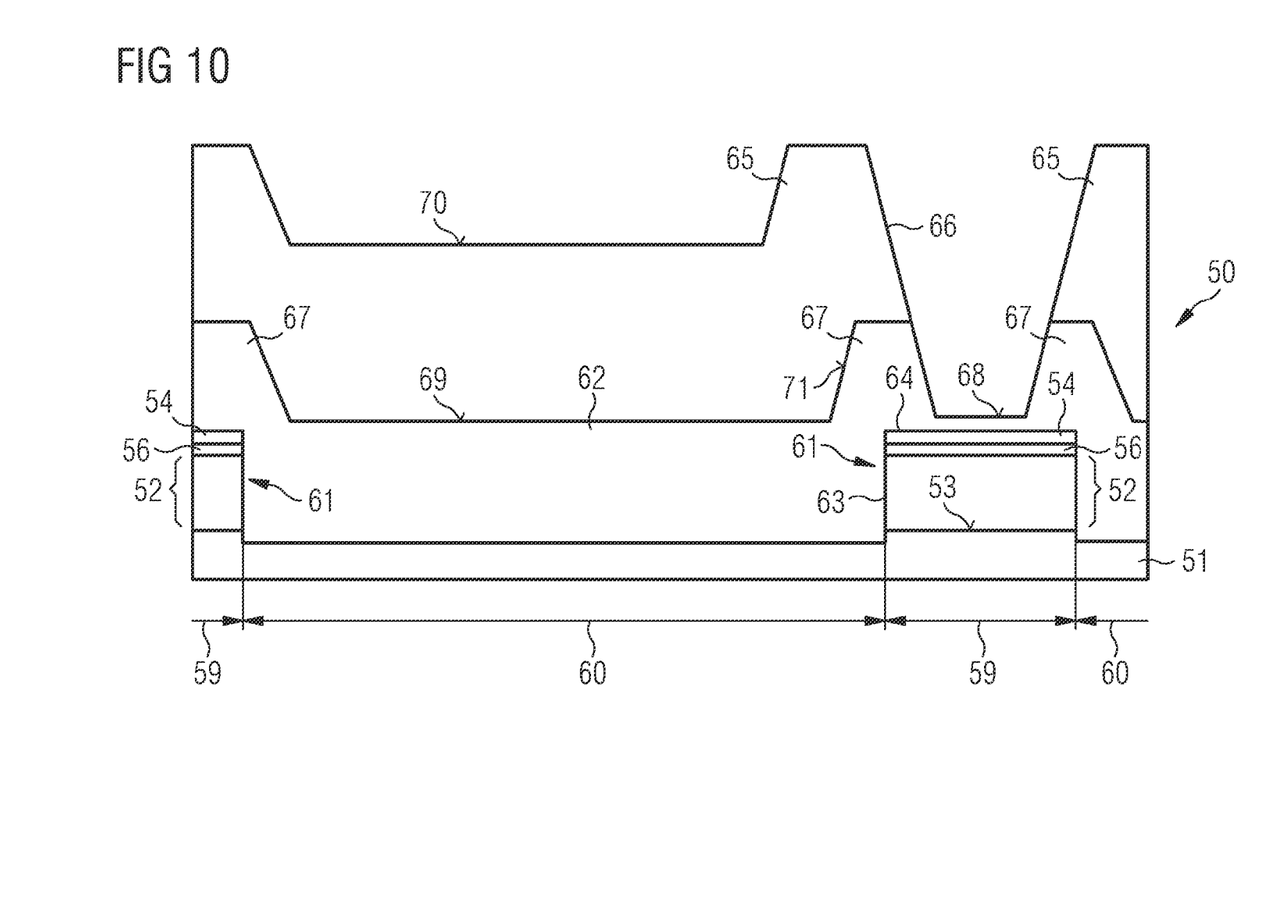
FIG. 10 illustrates a structured mask on the insulating layer and partial removal of the insulating layer above the mesas.
Figure 11:
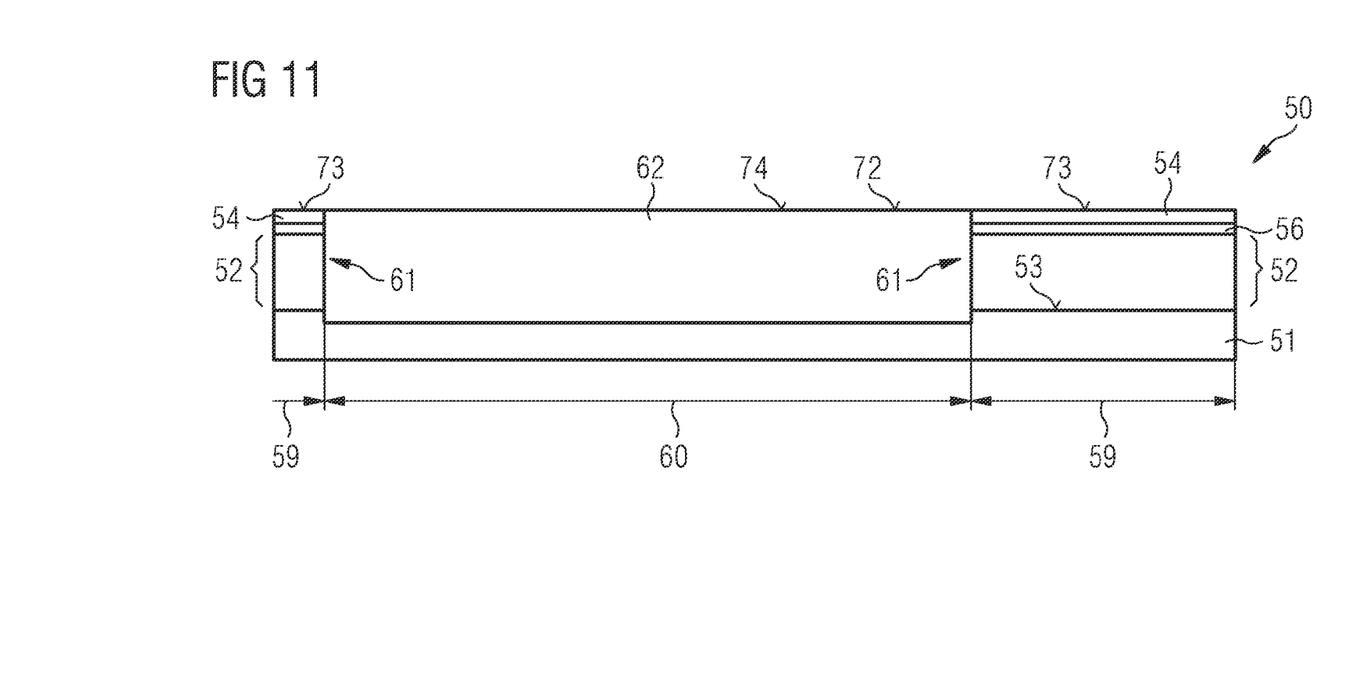
FIG. 11 illustrates the semiconductor substrate after planarization of the insulating layer and the mesas.

FIGS. 9 to 11 illustrate embodiments of a method for planarising the arrangement illustrated in FIG. 8 including mesas 61 on the upper surface 53 of the substrate 51.

FIG. 9 illustrates the semiconductor wafer 50 after the deposition of an insulating layer 62 onto the upper surface of the substrate 51 in the passive regions 60, over side faces 63 and an upper surface 64 of the mesas 61, in particular on the stop layer 54. The insulating layer 62 is substantially conformally deposited such that it includes a raised portion above the upper surface 64 and side faces 63 of the mesas 61.

The insulating layer 62 may have a thickness t and the mesa a height $h_m$, such that $1.5h_m \leq t \leq 1.8h_m$. If the insulating layer 62 includes a silicon oxide, such as $SiO_x$, which is deposited using CVD or PVD, the insulating layer 62 may be annealed after deposition to increase its density.

FIG. 10 illustrates a structured mask 65 arranged on the insulating layer 62. The structured mask 65 has an opening 66 above each of the mesas 61. The opening 66 has a lateral area which is less than the lateral area of the upper surface 64 of the mesa 61 such that the peripheral regions and edges of the mesa 61 are covered by the material of the mask 65.

A portion of the insulating layer 62 is removed through the opening 66 to reduce the thickness of the insulating layer 62 at the base of the opening 66 such that the upper surface 64 of mesa 61 remains covered by material of the insulating layer 62. The thickness of the insulating layer 66 on the upper surface 64 of the mesa 61 may be around 200 nm to 400 nm. The upper surface 68 of the remaining portion of the first layer 62 within the opening 66 may be substantially coplanar with the upper surface 69 of the insulating layer 62 in the passive region 60.

The insulating layer 62 includes a protrusion 67 which is positioned above the side faces 63 and extends into regions either side of the side faces 63 of the mesa 61 and onto the upper surface 64 of the mesa 61. The protruding region 67 of the insulating layer 62 is positioned in the peripheral region of the device region 59 and the peripheral region of the mesa 61 and at interfaces between the passive regions 60 and device regions 59.

The mask 65 is removed, for example by an ashing process and the outermost surface 71 of the insulating layer 62 are progressively removed, for example by chemical mechanical polishing, to produce a planarised surface 74 in which the upper surface 72 of the first layer 62 in the passive regions 60 and the upper surface 73 of the stop layer 54 on the mesa 61 in the device regions 59 are substantially coplanar, as is illustrated in FIG. 11. The stop layer 54 protects the underlying semiconductor material of the mesa during the planarization process, in particular during chemical mechanical polishing.

The stop layer 54 may be removed, for example by oxidation in the case of a carbon-containing stop layer 54.

In embodiments in which a passivation layer 56 is formed on the semiconductor structure 52, the upper surface 74 of the semiconductor wafer 50 includes only insulating and dielectric material and no semiconductor material and consequently includes protection for the underlying semiconductor structure 52. The semiconductor wafer 50 includes a layer on its upper surface which includes a majority of insulating material in which isolated and discrete regions of the semiconductor structure 52 are arranged.

Figure 12:
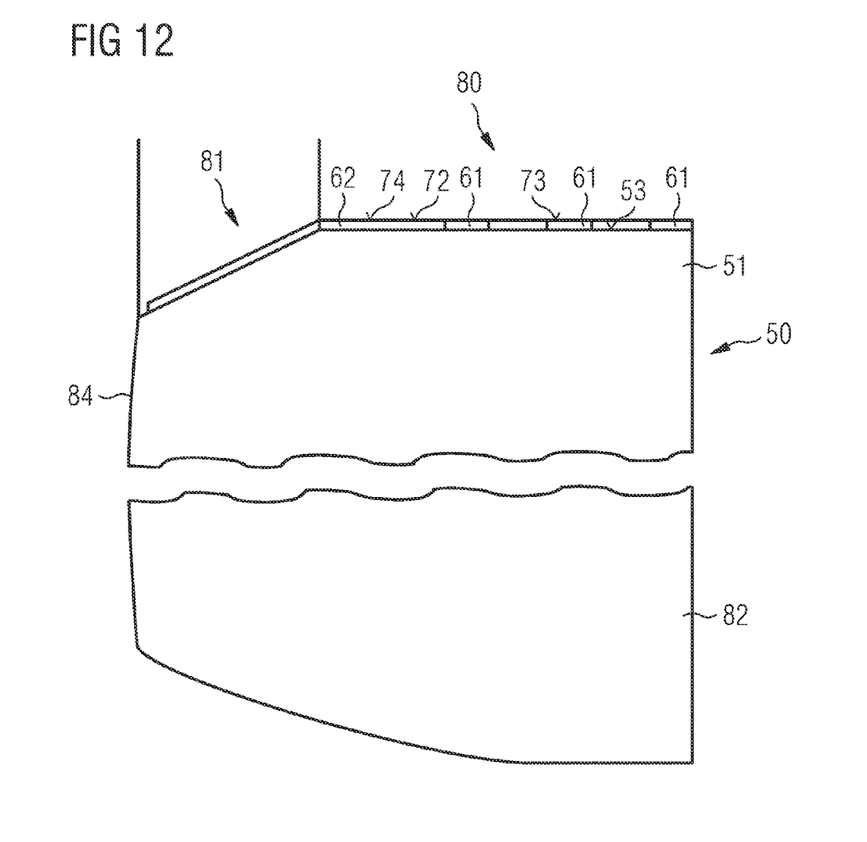
FIG. 12 illustrates a cross-sectional view of a semiconductor wafer edge region including a planarised surface.

FIG. 12 illustrates a cross-sectional view of a portion of the semiconductor wafer 50 having a planarised surface 74. The semiconductor wafer 50 includes the substrate 51 in the form of a wafer having a planar device surface region 80 in the centre of its upper surface 53 which is surrounded by a peripheral region 81. The peripheral region 81 includes a bevel which extends at an inclined angle towards the opposing rear surface 82 of the substrate wafer 51 to an edge surface 84 which extends substantially perpendicularly to the device surface region 80.

The substrate wafer 51 may have an upper surface 53 in the device surface region 80 which is capable of supporting the epitaxial growth of one or more Group III nitride layers. The substrate wafer 51 may include a <100> silicon wafer, a <111> silicon wafer, a sapphire wafer or silicon carbide.

A plurality of mesas 61 including an epitaxial Group III nitride-based semiconductor structure 52 are arranged on the upper surface 53 of the substrate wafer 51 in the device surface region 80. The wafer 50 also includes the insulating layer 62 which is arranged on the device surface region 80 and on the peripheral region 81 which has an upper surface 72 which lies in a plane above an upper surface 73 of the mesas 61 in the device surface region 80 due to the removal of the stop layer from the mesas 61.

The wafer 50 includes a planar frontside surface 74 includes regions of the insulating layer 62, for example silicon dioxide, and regions of passivation layer 56 while the wafer bevel 81 includes silicon or silicon dioxide, for example, only. This arrangement may be used to avoid possible contamination of the processing equipment by elements such as gallium and aluminium, since these elements are not present on in the peripheral region 81 which may be subject to mechanical handling during subsequent processing.

The method of producing the planarised surface 74 allows a surface planarity variation of less than ±10% of a height of the mesa over a wafer diameter of 200 mm, also for mesas having height of 0.5 μm to 10 μm.

In the illustrated embodiment, the mesas 61 have the form of discrete protrusions which are spaced apart from one another by regions of the insulating layer 62. However, in other embodiments, the protruding structures providing mesas for semiconductor devices may be connected to neighbouring protruding regions by portions of including one or more Group III nitride layers.

One or more Group III nitride epitaxially grown over the entire surface of a wafer, such as a single crystal silicon wafer, may result in bowing of the wafer due to the highly compressive or tensile individual epitaxial Group III nitride layer(s) and due to the high in-plane lattice mismatch and difference in thermal coefficient of expansion between the Group III nitride layer and the substrate. Wafer bow values of up to 200 μm at the centre for a 200 mm wafer may occur. As a consequence, these wafers may exhibit fragility during processing in a semiconductor production line.

However, the majority of the material arranged on the upper surface 53 of the semiconductor wafer 50 includes insulating material rather than epitaxially deposited Group III nitride layers. The total area occupied by the Group III nitride containing regions 61 on the upper surface 74 the substrate wafer 51 may lie within 10% to 90% of the total area of the wafer 50. Consequently, this arrangement may be used to decrease any bow of the semiconductor wafer 50 in order to assists in the automatic handling of the semiconductor wafer 50 in subsequent processing steps.

The wafer 50 may have a wafer bow b of less than 200 μm, wherein $$100 * t * b / d^2 \leq 15$$

wherein d is wafer diameter, t is thickness of the epitaxially deposited Group III nitride layers and b is wafer bow at centre of the wafer. The diameter d may be 200 mm and the thickness t may be 1 μm to 10 μm. A wafer of 200 mm diameter may have a thickness of around 725 μm.

Figure 13:
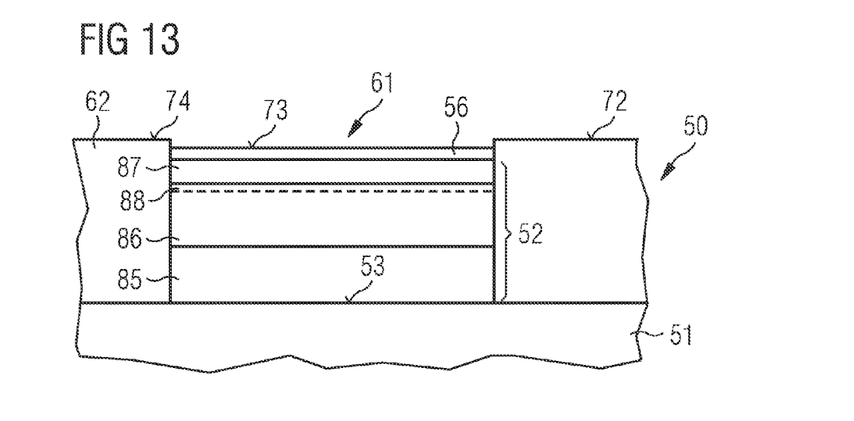
FIG. 13 illustrates an enlarged view of the semiconductor wafer of FIG. 12.

FIG. 13 illustrates an enlarged view of a portion of the upper surface 53 of the substrate wafer 50 and illustrates the structure of the mesas 61 in more detail. The semiconductor structure 52 includes a transition or buffer structure 85 including one or more Group III nitride layers which are epitaxially deposited on the upper surface 53 in the device surface region 80 of the substrate 51. The transition structure 85 may include a buffer layer arranged on the upper surface 53 and a superlattice structure including alternating Group III nitride layers of different bandgap. The semiconductor structure 52 may include a channel layer 86 arranged on the transition structure 85 and a barrier layer 87 arranged on the channel layer 86.

The channel layer 86 and the barrier layer 87 include Group III nitride compounds of differing bandgap such that a two-dimensional charge gas is formed at the interface 88 between the channel layer 86 and the barrier layer 87 by induced and spontaneous polarization. The channel layer 86 may include gallium nitride and the barrier layer 87 may include an aluminium gallium nitride. One or more further layers 89 such as a cap layer including gallium nitride may be arranged on the barrier layer 87. The passivation layer 56 may be formed the outermost surface of the mesa 61. The passivation layer 56 may include silicon nitride, for example. The upper surface 73 of the mesa 61 provided by the passivation layer 56 lies in a plane below the upper surface 72 of the insulating layer 62 surrounding the mesa 61.

The wafer 50 may be subsequently processed to deposit a metallization structure onto the mesas 61 to form transistor devices.

Figure 14:
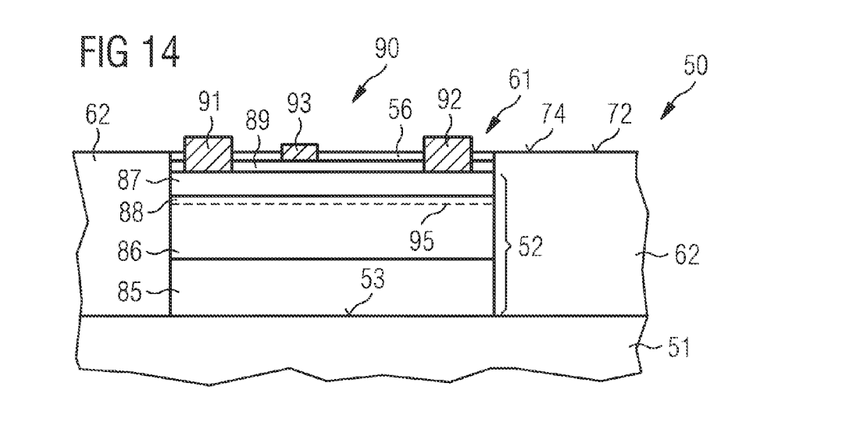
FIG. 14 illustrates an enlarged view of the semiconductor wafer after further processing to deposit a metallization structure and form a depletion mode transistor.
Figure 15:
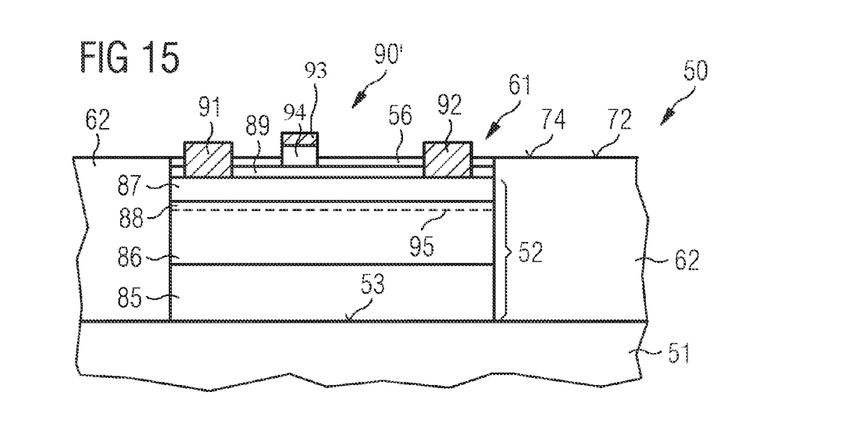
FIG. 15 illustrates an enlarged view of the semiconductor wafer after further processing to deposit a metallization structure and form an enhancement mode transistor.

FIGS. 14 and 15 illustrate a cross-sectional view of a portion of the semiconductor wafer 50 after further processing to deposit a metallization structure and form a Group III nitride-based transistor device in the form of a HEMT (High Electron Mobility Transistor).

In the embodiment illustrated in FIG. 14, the HEMT 90 is a depletion mode device which is normally on. The HEMT 90 may include the buffer structure 85, Group III nitride channel layer 86 including GaN and the Group III nitride barrier layer 87 including aluminium gallium nitride ($Al_xGa_{1-x}N$ where $0<x<1$) arranged on the channel layer 86. A metal source 91, metal drain 92 and metal gate 93 are arranged on the Group III nitride barrier layer 87. The metal gate 93 forms a Schottky barrier contact and the source 92 and drain 92 form an ohmic metal contact.

A two-dimensional charge gas such as a two-dimensional electron gas (2DEG) may be formed by piezoelectric and spontaneous polarization at the interface between the channel layer 86 and the barrier layer 87 as is indicated by the dashed line 95. The HEMT 90 may have a breakdown voltage of at least 200V.

In the embodiment illustrated in FIG. 15, the HEMT 90' is an enhancement mode device which may include the buffer structure 85, Group III nitride channel layer 86 including GaN and the Group III nitride barrier layer 87 including aluminium gallium nitride ($Al_xGa_{1-x}N$ where $0<x<1$) arranged on the channel layer 86. A metal source 91, metal drain 92 and metal gate 93 are arranged on the Group III nitride barrier layer 87. In this embodiment, a further p-doped Group III nitride layer 94 is arranged between the gate 93 and the Group III nitride barrier layer 87. The p-doped Group III nitride layer 94 may include magnesium-doped GaN. In the structure of the HEMT 90, the p-doped Group III nitride layer 4 has a defined lateral extent and height. The p-doped Group III nitride layer 94 under the gate 93 may be used to form an enhancement mode device which is normally off. In other non-illustrated embodiments, a recessed gate structure may be used to from an enhancement mode device.

A two-dimensional charge gas such as a two-dimensional electron gas (2DEG) may be formed by piezoelectric and spontaneous polarization at the interface between the channel layer 86 and the barrier layer 87 as is indicated by the dashed line 95. The HEMT 90, 90' may be a high-voltage device, for example have a blocking voltage capability of at least 600V.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of planarising a surface, the method comprising:

forming a Group III nitride-based semiconductor structure on an upper surface of a semiconductor substrate, the upper surface capable of supporting epitaxial growth of one or more Group III nitride layers;

forming a stop layer on the Group III nitride-based semiconductor structure;

removing unprotected regions of the stop layer and the Group III nitride-based semiconductor structure from the upper surface of the semiconductor substrate to expose part of the upper surface of the semiconductor substrate and form a plurality of protruding regions on the upper surface of the semiconductor substrate, each protruding region comprising at least one compound semiconductor;

covering the exposed part of the upper surface of the semiconductor substrate and side faces and an upper surface of each protruding region with a first layer;

removing a portion of the first layer above the protruding regions and forming an indentation in the first layer above the protruding regions, the protruding regions remaining covered by material of the first layer;

progressively removing an outermost surface of the first layer to produce a planarised surface comprising the stop layer on the upper surface of the protruding regions and an outer surface of the first layer;

forming a power transistor device in the protruding regions.

2. The method of claim 1, wherein the stop layer comprises a material having an etch selectivity of greater than 1000 over the material of the first layer, the material of the first layer having the higher etching rate.

3. The method of claim 1, wherein the stop layer comprises carbon.

4. The method of claim 3, wherein the stop layer comprises amorphous hydrogenated carbon.

5. The method of claim 1, wherein the outermost surface of the first layer is progressively removed by chemical mechanical polishing.

6. The method of claim 5, wherein the first layer is progressively removed using a colloidal silica based slurry.

7. The method of claim 1, wherein the indentation in the first layer above each protruding region has a lateral area smaller than the lateral area of the protruding region.

8. The method of claim 1, wherein the at least one Group III nitride is removed such that a total area occupied by the mesa lies within 10% to 90% of a total area of the substrate.

9. The method of claim 1, wherein after the protruding regions are formed on the upper surface of the semiconductor substrate, a majority of material arranged on the upper surface of the semiconductor substrate is insulating material rather than epitaxially deposited Group III nitride material.

10. The method of claim 1, further comprising:
removing unprotected portions of the upper surface of the semiconductor substrate between neighbouring ones of the protruding regions such that remaining portions of the Group III nitride-based semiconductor structure and the stop layer in device regions are positioned on a raised region of the semiconductor substrate.

11. A method of fabricating a semiconductor wafer, the method comprising:
depositing an insulating layer onto a substrate comprising a mesa comprising a stop layer arranged on at least one Group III nitride such that an upper surface of the substrate and the mesa are covered with the insulating layer;
forming a structured mask on the insulating layer having an opening above the mesa, the opening having a lateral area smaller than a lateral area of the mesa;
removing a portion of the insulating layer within the opening and reducing a thickness of the portion of the insulating layer arranged above the mesa;
progressively removing the mask and portions of the insulating layer to produce a planarised surface comprising a surface of the stop layer and a surface of the insulating layer;
applying a sacrificial layer onto the stop layer;
applying a structured mask to the sacrificial layer having openings;
removing portions of the sacrificial layer exposed in the openings and the stop layer to expose discrete areas of the at least one Group III nitride; and
removing the at least one Group III nitride in regions uncovered by the sacrificial layer to form at least one mesa on the upper surface of the substrate and expose a surface of the substrate.

12. The method of claim 11, wherein the portions of the insulating layer are progressively removed by chemical mechanical polishing.

13. The method of claim 11, wherein an initial thickness of the insulating layer above the mesa is reduced by 80% to 90%.

14. The method of claim 11, wherein the insulating layer and the structured mask provide a protrusion at edges of the mesa.

15. The method of claim 11, wherein removing the portion of the insulating layer within the opening further comprises forming an indentation in the insulating layer above the mesa such that the mesa remains covered by material of the insulating layer.

16. The method of claim 15, wherein the stop layer comprises carbon.

17. The method of claim 16, wherein the stop layer comprises amorphous hydrogenated carbon.

18. The method of claim 17, wherein the mesa further comprises a passivation layer arranged between the stop layer and an uppermost Group III nitride layer.

19. The method of claim 11, wherein the substrate is a semiconductor wafer having a diameter of 200 mm and a surface planarity which is ±10% of a height of the mesa.

20. The method of claim 11, wherein the substrate comprises a <100> silicon wafer, a <111> silicon wafer, a sapphire wafer or silicon carbide.

21. The method of claim 11, further comprising removing the stop layer after progressively removing the mask and portions of the insulating layer.

22. The method of claim 21, wherein removing the stop layer comprises oxidising the stop layer.

23. A method of fabricating a semiconductor wafer, the method comprising:
depositing an insulating layer onto a substrate comprising a mesa comprising a stop layer arranged on at least one Group III nitride such that an upper surface of the substrate and the mesa are covered with the insulating layer;
forming a structured mask on the insulating layer having an opening above the mesa, the opening having a lateral area smaller than a lateral area of the mesa;
removing a portion of the insulating layer within the opening and reducing a thickness of the portion of the insulating layer arranged above the mesa; and
progressively removing the mask and portions of the insulating layer to produce a planarised surface comprising a surface of the stop layer and a surface of the insulating layer,
wherein removing the portion of the insulating layer within the opening further comprises forming an indentation in the insulating layer above the mesa such that the mesa remains covered by material of the insulating layer,
wherein the stop layer comprises amorphous hydrogenated carbon,
wherein the mesa further comprises a passivation layer arranged between the stop layer and an uppermost Group III nitride layer.

* * * * *

UNITED STATES PATENT AND TRADEMARK OFFICE
CERTIFICATE OF CORRECTION

PATENT NO. : 10,134,603 B2
APPLICATION NO. : 15/273303
DATED : November 20, 2018
INVENTOR(S) : Birner et al.

Page 1 of 1

It is certified that error appears in the above-identified patent and that said Letters Patent is hereby corrected as shown below:

On the Title Page

Item (57), (Line 1), please change "planarizing" to -- planarising --.
Item (57), (Line 10), please change "planarized" to -- planarising --.

Signed and Sealed this
Twelfth Day of February, 2019

Andrei Iancu
*Director of the United States Patent and Trademark Office*